(12) United States Patent
Huai

(10) Patent No.: US 6,967,863 B2
(45) Date of Patent: Nov. 22, 2005

(54) PERPENDICULAR MAGNETIZATION MAGNETIC ELEMENT UTILIZING SPIN TRANSFER

(75) Inventor: Yiming Huai, Pleasanton, CA (US)

(73) Assignee: Grandis, Inc., Milpitas, CA (US)

( * ) Notice: Subject to any disclaimer, the term of this patent is extended or adjusted under 35 U.S.C. 154(b) by 32 days.

(21) Appl. No.: 10/787,701

(22) Filed: Feb. 25, 2004

(65) Prior Publication Data

US 2005/0185455 A1    Aug. 25, 2005

(51) Int. Cl.$^7$ ............................................. G11C 11/00
(52) U.S. Cl. ........................ 365/158; 365/171; 365/173
(58) Field of Search ............................... 365/158, 171, 365/173

(56) References Cited

U.S. PATENT DOCUMENTS

| | | | |
|---|---|---|---|
| 5,764,567 A * | 6/1998 | Parkin ........................ | 365/173 |
| 6,438,026 B2 * | 8/2002 | Gillies et al. ................ | 365/158 |
| 6,532,164 B2 | 3/2003 | Redon et al. | |
| 6,714,444 B2 * | 3/2004 | Huai et al. ................... | 365/171 |
| 6,888,742 B1 * | 5/2005 | Nguyen et al. ............. | 365/158 |
| 2002/0105827 A1 | 8/2002 | Redon et al. | |
| 2003/0007398 A1 | 1/2003 | Daughton et al. | |
| 2003/0059588 A1 | 3/2003 | Hannah et al. | |

OTHER PUBLICATIONS

J.F. Albert, et al, "Polarized Current Switching of a CO Thin Film Nanomagnet", American Institute of Physics, vol. 77, No. 23, Dec. 4, 2000, pp. 3809-3811.

J.A. Katine, et al, "Current-Driven Magnetization Reversal and Spin-Wave Excitations in Co/Cu/Co Pillars", the American Physical Society, vol. 84, No. 14, Apr. 3, 2000, pp. 3149-3151.

E.G. Myers, et al, "Point-Contact Studies of Current-Controlled Domain Switching in Magnetic Multilayers" Journal of Applied Physics, vol. 87, No. 9, May 1, 2000, pp. 5502-5503.

J.C. Slonczewski, "Theory and Application of Exchange-Driven Switching", IEEE, Apr. 2000, pp. CE-02.

J.C. Slonczewski, "Current-Driven Excitation on Magnetic Multilayers", Journal of Magnetism and Magnetic Materials, 1996, pp. 1.1-1.7.

J.C. Slonczewski, "Conductance and Exchange Coupling of Two Ferromagnets Separated by a Tunneling Barrier", The American Physical Society, vol. 39, No. 10, Apr. 1, 1999, pp. 6995-7002.

J.Z. Sun, "Current-Driven Magnetic Switching in Manganite Trilayer Junctions", Journal of Magnetism and Magnetic Materials, No. 202, 1999, pp. 157-162.

N. Nishimura, et al, "Magnetic Tunnel Junction Device with Perpendicular Magnetization Films for High-Density Magnetic Random Access Memory", Journal Of Applied Physics, vol. 91, No. 8, Apr. 15, 2002, pp 5246-5249.

* cited by examiner

Primary Examiner—Son T. Dinh
(74) Attorney, Agent, or Firm—Sawyer Law Group LLP

(57) ABSTRACT

A method and system for providing a magnetic element that can be used in a magnetic memory is disclosed. The method and system include providing a first pinned layer, a barrier layer, a free layer, a conductive nonmagnetic spacer layer, and a second pinned layer. Each pinned layer has a pinned layer easy axis. At least a portion of the pinned layer easy axis is in a perpendicular direction. The barrier layer resides between the first pinned layer and the free layer. The spacer layer is between the free layer and the second pinned layer. The free layer has a free layer easy axis, at least a portion of which is in the perpendicular direction. The magnetic element is also configured to allow the free layer to be switched due to spin transfer effect when a write current is passed through the magnetic element. Because of the perpendicular magnetization(s), the writing current for spin transfer may be significantly reduced.

40 Claims, 5 Drawing Sheets

PERPENDICULAR MAGNETIZATION MAGNETIC ELEMENT UTILIZING SPIN TRANSFER

FIELD OF THE INVENTION

The present invention relates to magnetic memory systems, and more particularly to a method and system for providing a magnetic element having perpendicular magnetization layers, that employs spin transfer induced switching, and that can be used in a magnetic memory such as magnetic random access memory ("MRAM").

BACKGROUND OF THE INVENTION

FIGS. 1A and 1B depict conventional magnetic elements 10 and 10'. The conventional magnetic element 10 is a spin valve and includes a conventional antiferromagnetic (AFM) layer 12, a conventional pinned layer 14, a conventional nonmagnetic spacer layer 16 and a conventional free layer 18. Other layers (not shown), such as seed or capping layer may also be used. The conventional pinned layer 14 and the conventional free layer 18 are ferromagnetic. Thus, the conventional free layer 18 is depicted as having a changeable magnetization 19. The conventional nonmagnetic spacer layer 16 is conductive. The AFM layer 12 is used to fix, or pin, the magnetization of the pinned layer 14 in a particular direction. The magnetization of the free layer 18 is free to rotate, typically in response to an external magnetic field. The conventional magnetic element 10' depicted in FIG. 1B is a spin tunneling junction. Portions of the conventional spin tunneling junction 10' are analogous to the conventional spin valve 10. Thus, the conventional magnetic element 10' includes an AFM layer 12', a conventional pinned layer 14', a conventional insulating barrier layer 16' and a conventional free layer 18' having a changeable magnetization 19'. The conventional barrier layer 16' is thin enough for electrons to tunnel through in a conventional spin tunneling junction 10'.

Depending upon the orientations of the magnetization 19/19' of the conventional free layer 18/18' and the conventional pinned layer 14/14', respectively, the resistance of the conventional magnetic element 10/10', respectively, changes. When the magnetization 19/19' of the conventional free layer 18/18' is parallel with the magnetization of the conventional pinned layer 14/14', the resistance of the conventional magnetic element 10/10' is low. When the magnetization 19/19' of the conventional free layer 18/18' is antiparallel to the magnetization of the conventional pinned layer 14/14', the resistance of the conventional magnetic element 10/10' is high.

To sense the resistance of the conventional magnetic element 10/10', current is driven through the conventional magnetic element 10/10'. Current can be driven in one of two configurations, current in plane ("CIP") and current perpendicular to the plane ("CPP"). In the CPP configuration, current is driven perpendicular to the layers of conventional magnetic element 10/10' (up or down as seen in FIG. 1A or 1B). Typically, in memory applications, such as magnetic random access memory (MRAM) applications, the conventional magnetic elements 10 and 10' are used in the CPP configuration.

FIG. 2 depicts another conventional magnetic element 50 utilizing layers having perpendicular magnetization. The conventional magnetic element 50 is a spin tunneling junction. The magnetic element 50 may be used in a memory cell. The magnetic element 50 includes a conventional pinned layer 60 having a magnetization 62, a barrier layer 70, and a conventional free layer 80 having a magnetization 82. The conventional pinned layer 60 and conventional free layer 80 are ferromagnetic and have their magnetizations 62 and 82, respectively, perpendicular to the plane of the layers 60 and 80, respectively. As used herein, perpendicular describes the direction normal to the plane of the layers of a magnetic element.

The conventional free layer 80 may includes a high spin polarization layer such as Co (not separately depicted in FIG. 2), and a rare earth-transition metal alloy layer such as GdFeCo (not separately depicted in FIG. 2). The conventional pinned layer 60 includes a high spin polarization layer such as Co (not separately depicted in FIG. 2), and a rare earth-transition metal alloy layer such as TbFeCo (not separately depicted in FIG. 2).

In order to overcome some of the issues associated with magnetic memories having a higher density of memory cells, it has been proposed that spin transfer be utilized for the magnetic elements 10 and 10'. In particular, spin transfer may be used to switch the magnetizations 19/19' of the conventional free layers 18/18'. Spin transfer is described in the context of the conventional magnetic element 10', but is equally applicable to the conventional magnetic element 10. Current knowledge of spin transfer is described in detail in the following publications: J. C. Slonczewski, "Current-driven Excitation of Magnetic Multilayers," *Journal of Magnetism and Magnetic Materials*, vol. 159, p. L1 (1996); L. Berger, "Emission of Spin Waves by a Magnetic Multilayer Traversed by a Current," *Phys. Rev. B*, vol. 54, p. 9353 (1996), and F. J. Albert, J. A. Katine and R. A. Buhrman, "Spin-polarized Current Switching of a Co Thin Film Nanomagnet," *Appl. Phys. Lett.*, vol. 77, No. 23, p. 3809 (2000). Thus, the following description of the spin transfer phenomenon is based upon current knowledge and is not intended to limit the scope of the invention.

When a spin-polarized current traverses a magnetic multilayer such as the spin tunneling junction 10' in a CPP configuration, a portion of the spin angular momentum of electrons incident on a ferromagnetic layer may be transferred to the ferromagnetic layer. In particular, electrons incident on the conventional free layer 18' may transfer a portion of their spin angular momentum to the conventional free layer 18'. As a result, a spin-polarized current can switch the magnetization 19' direction of the conventional free layer 18' if the current density is sufficiently high (approximately $10^7$–$10^8$ A/cm$^2$) and the lateral dimensions of the spin tunneling junction are small (approximately less than two hundred nanometers). In addition, for spin transfer to be able to switch the magnetization 19' direction of the conventional free layer 18', the conventional free layer 18' should be sufficiently thin, for instance, preferably less than approximately ten nanometers for Co. Spin transfer based switching of magnetization dominates over other switching mechanisms and becomes observable when the lateral dimensions of the conventional magnetic element 10/10' are small, in the range of few hundred nanometers. Consequently, spin transfer is suitable for higher density magnetic memories having smaller magnetic elements 10/10'.

The phenomenon of spin transfer can be used in the CPP configuration as an alternative to or in addition to using an external switching field to switch the direction of magnetization of the conventional free layer 18' of the conventional spin tunneling junction 10'. For example, the magnetization 19' of the conventional free layer 18' can be switched from a direction antiparallel to the magnetization of the conventional pinned layer 14' to a direction parallel to the magnetization of the conventional pinned layer 14'. Current is driven from the conventional free layer 18' to the conventional pinned layer 14' (conduction electrons traveling from the conventional pinned layer 14' to the conventional free layer 18'). Thus, the majority electrons traveling from the conventional pinned layer 14' have their spins polarized in the same direction as the magnetization of the conventional pinned layer 14'. These electrons may transfer a sufficient portion of their angular momentum to the conventional free layer 18' to switch the magnetization 19' of the conventional free layer 18' to be parallel to that of the conventional pinned layer 14'. Alternatively, the magnetization of the free layer 18' can be switched from a direction parallel to the magnetization of the conventional pinned layer 14' to antiparallel to the magnetization of the conventional pinned layer 14'. When current is driven from the conventional pinned layer 14' to the conventional free layer 18' (conduction electrons traveling in the opposite direction), majority electrons have their spins polarized in the direction of magnetization of the conventional free layer 18'. These majority electrons are transmitted by the conventional pinned layer 14'. The minority electrons are reflected from the conventional pinned layer 14', return to the conventional free layer 18' and may transfer a sufficient amount of their angular momentum to switch the magnetization 19' of the free layer 18' antiparallel to that of the conventional pinned layer 14'.

Although spin transfer functions, one of ordinary skill in the art will readily recognize that it may be relatively difficult to write to the conventional magnetic elements 10 and 10' using spin transfer. In particular, a relatively high current density of greater than approximately $10^7$ A/cm² is generally required for spin transfer to become observable and useful in switching the magnetization 19 or 19' of the free layer 18 and 18', respectively. The high current density is typically achieved by utilizing a conventional magnetic element 10 or 10' having small, sub-micron lateral dimensions together with a high bias current. For example, for a magnetic element having lateral dimensions on the order of 0.1 µm by 0.2 µm, a bias current of about two milli-amperes is typically used. A reduction in the current density required to switch the magnetization 19 or 19' of the free layer 18 and 18', respectively, is desired for a variety of reasons. For magnetic memory applications, such as MRAM, a low power consumption and small isolation transistor dimensions are desirable. A high current density consumes greater power. In addition, the isolation transistor is typically coupled to each magnetic element. A high current density through the magnetic element requires a larger saturation current for the isolation transistor. The saturation current is proportional to the transistor size. Thus, the size of the transistor and the memory cell are increased by a high current density. Smaller memory cells and higher density memories are desirable. Such goals would be facilitated by the use of smaller transistor. Thus, the goals of low power consumption and high memory density are difficult to achieve when using a high current density. In addition, for the magnetic element 10', the insulating barrier layer 16' may undergo dielectric breakdown due to the presence of high current densities. Thus, the reliability of the magnetic element 10' is adversely affected.

A prevailing spin transfer model is given in the publication: J. C. Slonczewski, "Current-Driven Excitation of Magnetic Multilayer," *Journal of Magnetism and Magnetic Materials*, vol. 159, p 159, L1–L5 (1996). For the magnetic elements 10 and 10', the film plane is along the x-y plane. The z-direction is directed upwards (perpendicular to film plane) in FIG. 1B. The critical switching current density $J_c$ is the current required to switch the magnetization direction of a free layer for a given lateral dimensions. The switching current density for the magnetization 19 and 19' of the free layers 18 and 18', respectively, is described by:

$$J_c \propto \alpha M_s t(H_{eff//} + 2\pi M s)/g \tag{1}$$

Where
α represents the phenomenological Gilbert damping;
t is the thickness of the free layer 18 or 18';
$M_s$ is the saturation magnetization of the free layer 18 or 18';
$H_{eff//}$ is the in-plane effective field;
g corresponds to an efficiency of spin transfer switching; and
$2\pi M_s$ is due to the demagnetization field perpendicular to the film plane.

The in-plane effective field includes the in-plane uniaxial field, an external magnetic field, dipolar fields, and exchange fields. The demagnetization term, $2\pi M_s$, is on the order of thousands of Oe and dominates over the in-plane effective field term, which is on the order of hundreds of Oe. Thus, although conventional magnetic elements can use spin transfer as a switching mechanism, the switching current is high due to the large value of $2\pi M_s$ term. For the reasons discussed above, a high switching current is undesirable for magnetic memory application. Accordingly, what is needed is a system and method for providing a magnetic memory element that can be more easily switched using spin transfer at a low switching current, while providing a high output signal. The present invention addresses the need for such a magnetic memory element.

SUMMARY OF THE INVENTION

The present invention provides a method and system for providing a magnetic element that can be used in a magnetic memory. The method and system comprise providing a first pinned layer, an insulating barrier layer, a free layer, a conductive nonmagnetic spacer layer, and a second pinned layer. Each pinned layer has a pinned layer easy axis. At least a portion of the pinned layer easy axis is in a perpendicular direction. The barrier resides between the first pinned layer and the free layer. The spacer layer resides between the free layer and second pinned layer. The free layer has a free layer easy axis, at least a portion of which is in the perpendicular direction. The magnetic element is also configured to allow the free layer to be switched due to spin transfer when a write current is passed through the magnetic element.

According to the system and method disclosed herein, the present invention provides a magnetic element that is capable of being written at a reduced current using spin transfer.

DETAILED DESCRIPTION OF THE INVENTION

Figure 1A:
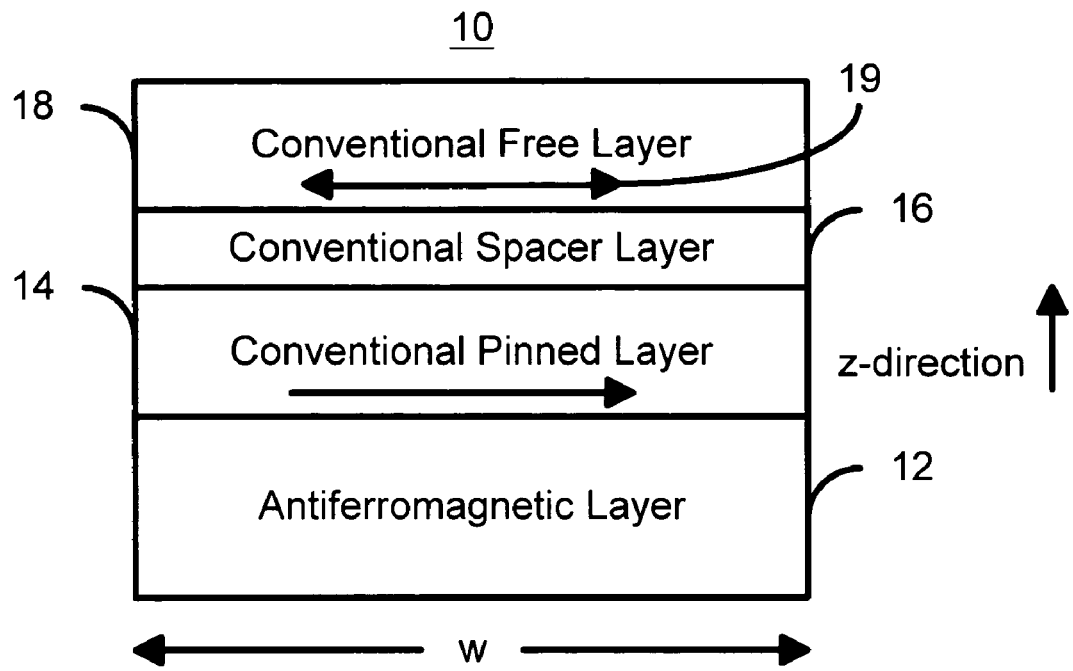
FIG. 1A is a diagram of a conventional magnetic element, a spin valve.
Figure 1B:
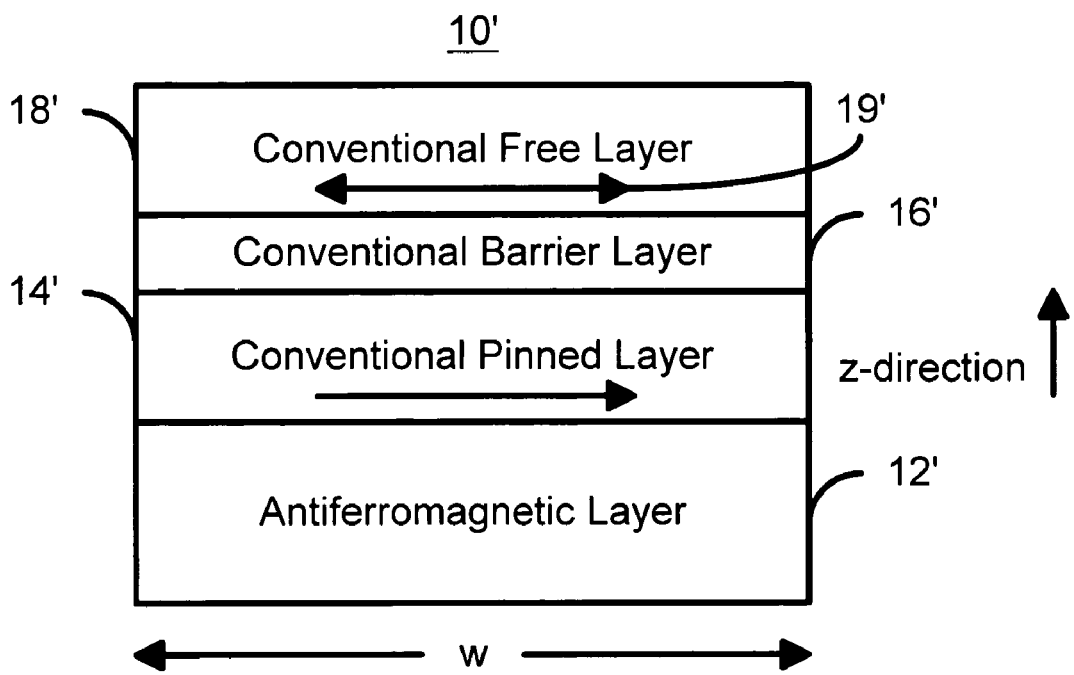
FIG. 1B is a diagram of another conventional magnetic element, a spin tunneling junction.
Figure 2:
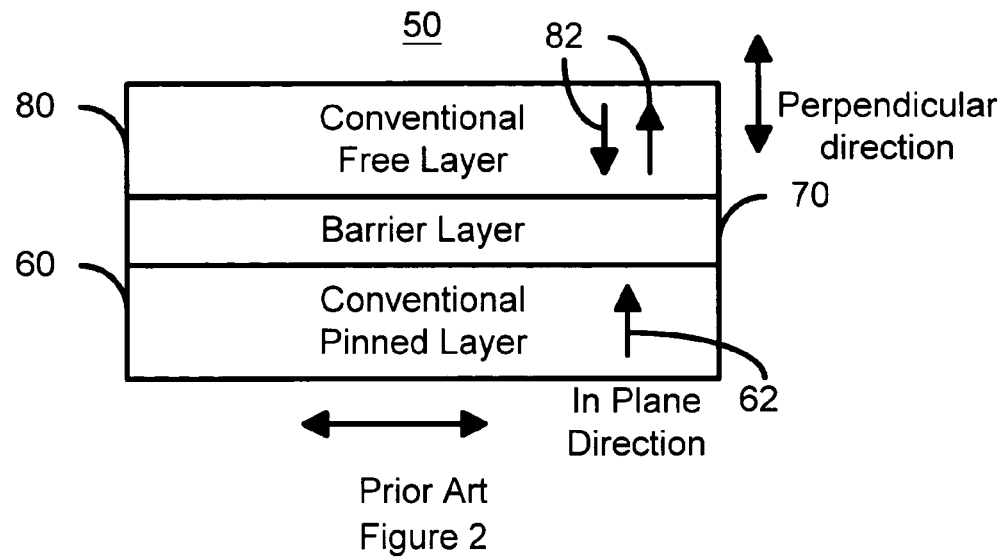
FIG. 2 depicts another conventional magnetic element having perpendicular magnetization.

The present invention relates to an improvement in magnetic elements and magnetic memories, such as MRAM. The following description is presented to enable one of ordinary skill in the art to make and use the invention and is provided in the context of a patent application and its requirements. Various modifications to the preferred embodiments will be readily apparent to those skilled in the art and the generic principles herein may be applied to other embodiments. Thus, the present invention is not intended to be limited to the embodiments shown, but is to be accorded the widest scope consistent with the principles and features described herein.

The present invention provides a method and system for providing a magnetic element that can be used in a magnetic memory. The method and system comprise providing a first pinned layer, an insulating barrier layer, a free layer, a conductive nonmagnetic spacer layer, and a second pinned layer. Each pinned layer has a pinned layer easy axis. At least a portion of the pinned layer easy axis is in a perpendicular direction. The barrier layer resides between the first pinned layer and the free layer. The spacer layer is between the free layer and the second pinned layer. The free layer has a free layer easy axis, at least a portion of which is in the perpendicular direction. The magnetic element is also configured to allow the free layer to be switched due to spin transfer when a write current is passed through the magnetic element. Due to the perpendicular magnetization(s), the switching current for spin transfer can be reduced.

The present invention will be described in terms of a particular magnetic memory and a particular magnetic element having certain components. However, one of ordinary skill in the art will readily recognize that this method and system will operate effectively for other magnetic memory elements having different and/or additional components and/or other magnetic memories having different and/or other features not inconsistent with the present invention. The present invention is also described in the context of current understanding of the spin transfer phenomenon. Consequently, one of ordinary skill in the art will readily recognize that theoretical explanations of the behavior of the method and system are made based upon this current understanding of spin transfer. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Moreover, certain components are described as being ferromagnetic. However, as used herein, the term ferromagnetic could include ferrimagnetic or like structures. Thus, as used herein, the term "ferromagnetic" includes, but is not limited to ferromagnets and ferrimagnets. The present invention is also described in the context of single elements lines. However, one of ordinary skill in the art will readily recognize that the present invention is consistent with the use of magnetic memories having multiple elements, bit lines, and word lines.

Figure 3A:
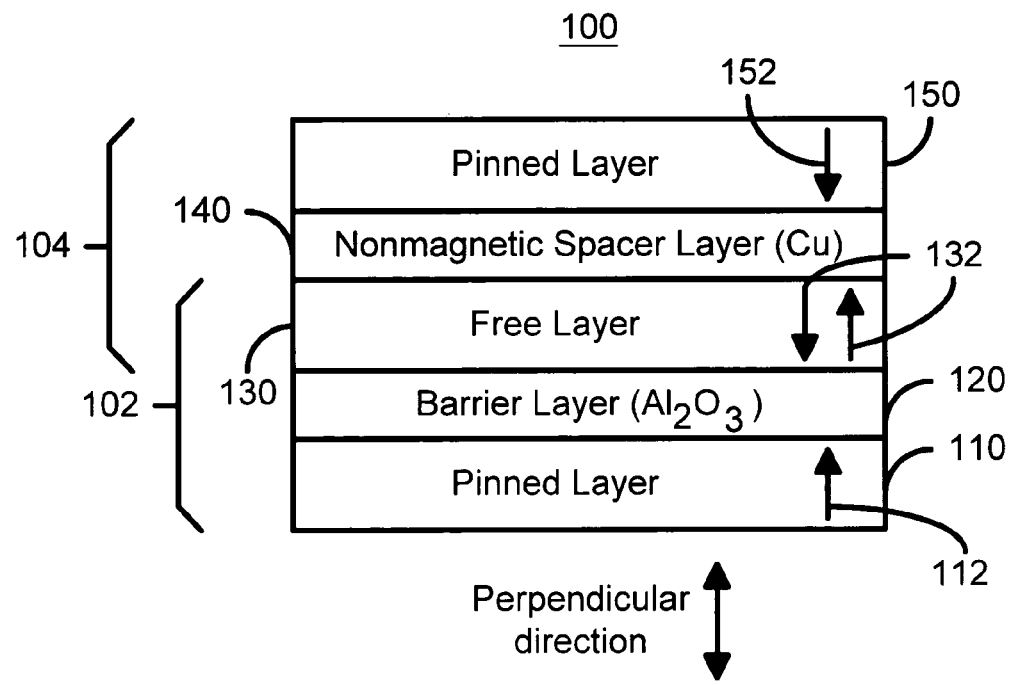
FIG. 3A is a first embodiment of a magnetic element in accordance with the present invention utilizing layers having perpendicular magnetization.

To more particularly illustrate the method and system in accordance with the present invention, refer now to FIG. 3A, depicting one embodiment of a magnetic element 100 in accordance with the present invention utilizing layers having perpendicular magnetization. The magnetic element 100 is preferably used in a magnetic memory, such as a MRAM. Thus, the magnetic element 100 may be used in a memory cell including an isolation transistor (not shown), as well as other configurations of magnetic memories. Note that in addition to the layers shown, the magnetic element 100 may include other layers such as AFM layer(s) (not shown), seed layer(s) (not shown), and/or capping layer(s) (not shown).

The magnetic element 100 includes a pinned layer 110, an insulating barrier layer 120 that is preferably $Al_2O_3$, a free layer 130, a nonmagnetic spacer layer 140 and a pinned layer 150. The nonmagnetic spacer layer 140 is conductive and is preferably Cu. The insulating barrier layer 120 is configured to allow charge carriers to tunnel between the free layer 130 and the pinned layer 110. The magnetic element 100 can be considered to include a spin tunneling junction portion 102 and a spin valve portion 104. The spin tunneling junction portion 102 includes pinned layer 110, insulating barrier layer 120, and free layer 130. The spin valve portion includes the free layer 130, the nonmagnetic spacer layer 140, and the pinned layer 150. The spin valve portion 104 and the spin tunneling junction portion 102 thus share the free layer 130. Furthermore, the magnetic element 100 is configured such that the free layer 130 can be written using spin transfer.

The pinned layers 110 and 150 and/or the free layer 130 are configured such that their magnetizations 112, 152, and/or 132, respectively, are stable with at least a portion of the magnetization being perpendicular to the plane of the layers 110 and 150 and/or 130, respectively. Preferably, the pinned layers 110 and 150 and free layer 130 have magnetizations 112, 152, and 132, respectively, that are stable substantially perpendicular to the plane of the layers 110, 150, and 130, respectively, as is depicted in FIG. 3A. Stated differently, at least a portion of the easy axis of the free layer 130 and, preferably, the pinned layers 110 and 150 are perpendicular to the plane of the layers 130, 110, and 150, respectively. As used herein, perpendicular describes the direction normal to the plane of the layers of a magnetic element. Furthermore, the magnetizations 112, 152, and 132 and the easy axes of the pinned layers 110 and 150 and the free layer 130, respectively, are described herein as being perpendicular. However, one of ordinary skill in the art will readily recognize that the layers 110, 130, and 150 may have some portion of their magnetizations 112, 132, and 153, respectively, and easy axes in plane. The magnetizations 112, 152, and 132 of the pinned layers 110 and 150 and/or the free layer 130 are perpendicular preferably because the pinned layers 110 and 150 and/or free layer 130 have a perpendicular anisotropy. For example, the perpendicular uniaxial anisotropy of the pinned layers 110 and 150 and/or free layer 130 could be due to interfacial (or surface) anisotropy and/or the effects of magneto-elastic energy.

The easy axis and magnetization 132 of the free layer 130 are preferably perpendicular. In one embodiment, the free layer 130 includes at least one ferromagnetic layer (not separately depicted in FIG. 3A), and a rare earth-transition metal alloy layer (not separately depicted in FIG. 3A). In a preferred embodiment, the rare earth-transition metal allowy layer is sandwiched between two ferromagnetic layers that are closer to the spacer layer 140 and the barrier layer 120. The ferromagnetic layer(s) of the free layer 130 preferably includes Co, Ni, Fe, their alloys, or CoX, CoFeX or CoNiFeX with X=Cu, B Ru, Re, Rh, Pt and Pd preferably being between five and sixty atomic percent. In addition, the thickness of the ferromagnetic layer is preferably between five and fifty Angstroms. The rare earth transition metal alloy layer is preferably GdFe, GdCoFe with a low coercivity. In a preferred embodiment, the coercivity of the rare earth transition metal alloy layer is between fifty and three hundred Oe and the thickness of the rare earth transition metal alloy layer is between three hundred and five hundred Angstroms. The rare-earth transition metal alloys are also amorphous films having a low magnetization and a perpendicular easy axis. As a result, when such rare earth transition metal films are deposited at room temperature, the free layer 130 has a perpendicular easy axis. In particular, the spins of the rare earth atoms are antiferromagnetically coupled with the spins of transition metals atoms. At appropriate thicknesses of the rare earth-transition metal alloy layer and the ferromagnetic layer, the rare earth transition metal alloy layer, such as GdCoFe, also enables perpendicular magnetization of the adjacent ferromagnetic layer(s) though exchange coupling. Moreover, the saturation magnetization of these rare-earth transition metal alloy layers can be adjusted as small as zero to one hundred fifty emu/cm$^3$ by varying the composition ratio of rare-earth and transition metal.

In another embodiment, the free layer 130 may be a multilayer structure. For example, in one such embodiment, the free layer 130 may be a bilayer of five to ten Angstroms of Co and fifteen to twenty-five Angstroms of Pt that is repeated. For example, such a bilayer would preferably be repeated three to six times. Similarly, the free layer 130 may be a bilayer of five to ten Angstroms of CoCr and fifteen to twenty-five Angstroms of Pt that is repeated. Such a bilayer would also preferably be repeated three to six times. In yet another embodiment, the free layer 130 may be a synthetic structure. For example, the free layer 130 could include a layer of Ru sandwiched between a layer of (Co/Pt)n/Co and a layer of (Co/Pt)n/Co, where n indicates that a particular bilayer is repeated n times. In a preferred embodiment, n is three, four, five, or six. In another, similar embodiment, the free layer 130 could include a layer of Ru sandwiched between a layer of (CoCr/Pt)n/CoCr and a layer of (CoCr/Pt)n/CoCr, where n indicates that a particular bilayer is repeated n times. In a preferred embodiment, n is three, four, five, or six. The (Co/Pt)n, (CoFe/Pt)n, and (CoCr/Pt)n multilayers, where n is three through six, exhibit a perpendicular uniaxial magnetic anisotropy because of a perpendicular anisotropy arising from the (ferromagnetic layer/Pt) interfaces. Although the above structures are preferred, other structures resulting in a free layer 130 having a perpendicular magnetization 132 could be utilized.

The pinned layers 110 and 150 also preferably have perpendicular magnetizations 112 and 152, respectively, and perpendicular easy axes due to perpendicular anisotropy. In one embodiment, the pinned layers 110 and 150 each includes a ferromagnetic layer (not separately depicted in FIG. 3A), and a rare earth-transition metal alloy layer (not separately depicted in FIG. 3A). In a preferred embodiment, the ferromagnetic layer is closer to the spacer layers 120 and 140. The ferromagnetic layers of the pinned layers 110 and 150 preferably include Co, Ni, Fe, their alloys, or CoX, CoFeX or CoNiFeX with X=Cu, B, Ru, Re, Rh, Pt, and Pd preferably being between five and sixty atomic percent. In addition, the thicknesses of the ferromagnetic layers are preferably between five and fifty Angstroms. The rare-earth transition metal alloys are amorphous films having a low magnetization and a perpendicular easy axis. As a result, when such rare earth transition metal films are deposited at room temperature and when the ferromagnetic layers and rare earth transition metal alloy films have the appropriate thicknesses, the pinned layers 110 and 150 have perpendicular easy axes. In particular, the spins of the rare earth atoms are antiferromagnetically coupled with the spins of transition metals atoms. The rare earth transition metal alloy layers, such as TdCoFe, enable perpendicular magnetization of the adjacent ferromagnetic layers though exchange coupling. The rare earth transition metal alloy layers for the pinned layers 110 and 150 are preferably TbFe and/or TbCoFe which have high coercivities. A high coercivity is a coercivity of at least one thousand Oe. For example, a TbCoFe layer generally has a coercivity in excess of two thousand Oe. In a preferred embodiment, the coercivity of the rare earth transition metal alloy layer is greater than kOe and the thickness of the rare earth transition metal alloy layer is between two hundred and five hundred Angstroms.

In another embodiment, the pinned layers 110 and 150 may each be a multilayer structure. For example, in one such embodiment, the pinned layer 110 or 150 can be a multilayer of an AFM material, a bilayer on the AFM material of five to ten Angstroms of Co and fifteen to twenty-five Angstroms of Pt that is repeated and a layer of Co on the bilayer. For example, such a bilayer would preferably be repeated three to six times. Similarly, the pinned layer 110 and/or 150 may be an AFM material, a bilayer on the AFM material of five to ten Angstroms of CoCr and fifteen to twenty-five Angstroms of Pt that is repeated and a layer of CoCr on the bilayer. Such a bilayer would also preferably be repeated three to six times. In such embodiments, the AFM material is preferably IrMn or PtMn. In yet another embodiment, the pinned layer 110 and/or 150 may be a synthetic structure. For example, the pinned layer 110 and/or 150 could include an AFM layer followed by a structure including a layer of Ru sandwiched between a layer of (Co/Pt)n/Co and a layer of (Co/Pt)n/Co, where n indicates that a particular bilayer is repeated n times. In a preferred embodiment, n is three, four, five, or six. In another, similar embodiment, the pinned layer 110 and/or 150 could include an AFM layer followed by a structure including a layer of Ru sandwiched between a layer of (CoCr/Pt)n/CoCr and a layer of (CoCr/Pt)n/CoCr, where n indicates that a particular bilayer is repeated n times. In a preferred embodiment, n is three, four, five, or six. The (Co/Pt)n, (CoFe/Pt)n, and CoCr/Pt multilayers, where n is three through six, exhibit a perpendicular uniaxial magnetic anisotropy because of a perpendicular anisotropy arising from the (ferromagnetic layer/Pt) interfaces. Although the above structures are preferred, other structures resulting in pinned layers 110 and/or 150 having perpendicular magnetizations 112 and 152 could be utilized.

In operation, the perpendicular anisotropy of the pinned layers 110 and 150 and the free layer 130, their easy axes, and the resulting stable states of the magnetizations 112, 152, and 132, respectively, are at least partially and preferably substantially perpendicular. The perpendicular anisotropy results in a lower switching current density for switching direction of the magnetization 132 of the free layer 130 using spin transfer. In general, for a film having a perpendicular (out of the plane of the layer) dominant anisotropy, the perpendicular anisotropy field $H_{eff,L}$ (including $4\pi M$ acting perpendicular to the plane) is significantly larger than $H_{eff//}$ (acting uniaxially in the plane). As a result, the out-of-plane of the film becomes a preferred direction of magnetization. The switching current density can then be expressed as:

$$J_c \propto \alpha M_s t (H_{an,L} - 2\pi Ms) \quad (2)$$

where $H_{an,L}$ is the perpendicular uniaxial anisotropy field. The perpendicular uniaxial anisotropy field could be due to interfacial (or surface) anisotropy and/or effect of magneto-elastic energy. The sign of $H_{an,L}$ is opposite to that of the term of $2\pi Ms$. The absolute value of $H_{an,L}$ is larger than that of $2\pi Ms$ for the case of the film having out-of-plane dominant (perpendicular) anisotropy. As a result, the stable state of the magnetizations (such as the magnetizations 132, 112 and 152) of such layers (such as the free layer 130 or the pinned layers 110 and 150) is preferably perpendicular. Moreover, the value of the term of $H_{an,L} - 2\pi Ms$ and, therefore, the switching current density $J_c$, can be reduced through optimization of $H_{an,L}$ of the perpendicular anisotropy of the free layer 130. Moreover, as can be seen from equation (2), a reduction of magnetization Ms of the free layer 130 is also an efficient way to reduce $J_c$, because $J_c$ is proportional to $Ms^2$.

Thus, using the free layer 130 and, in a preferred embodiment, the pinned layers 110 and 150 having perpendicular anisotropies, perpendicular easy axes, and, therefore, perpendicular magnetizations, the switching current density for the magnetic element 100 can be reduced. Moreover, the switching current density can be further reduced by lowering the saturation magnetization, Ms, of the free layer 130, for example by selecting the appropriate material(s) for the free layer 130. Thus, the magnetic element 100 can be more easily written using spin transfer. In addition, the stable perpendicular magnetizations 132, 112 and 152 of the free layer 130 and the pinned layers 110 and 150, respectively, can be achieved using the materials described above. As a result, the stable perpendicular magnetizations are achieved in the deep submicron magnetic element, for example 0.1 $\mu m \times 0.1$ $\mu m$. This is in contrast to in-plane magnetization films, which typically require a high aspect ratio to minimize magnetization curling and achieve a stable magnetization. Such a high aspect ratio may limit the reduction in size and the increase in density for memories using such magnetic elements. Thus, the magnetic element 100 can be used in high density memories. Furthermore, the coercivity of the free layer 130 is primarily determined by the difference in the perpendicular anisotropy, $H_{an,L} - 2\pi Ms$, and is thus insensitive to the lateral dimensions of the magnetic element 100. Consequently, the distribution in coercivities due to variations in patterning of magnetic elements 100 in a memory can be reduced or eliminated. Furthermore, when using the ferromagnetic layer and rare earth transition metal alloy layer combination for the pinned layers 110 and 150, the pinned layers 110 and 150 may have a small net magnetization. Consequently, the magnetostatic field due to the pinned layers 110 and 150 can be substantially reduced or eliminated. As a result, the offset in the magnetoresistance curve due to magnetostatic coupling between the pinned layers 110 and 150 and the free layer 130 can be reduced. Thus, reliability of the spin transfer writing operation is improved. Moreover, the magnetic element 100 may be simpler to fabricate. In many embodiments, the perpendicular magnetization free layer 130 and pinned layers 110 and 150 may be deposited using physical vapor deposition, such as magnetron sputtering.

Figure 3B:
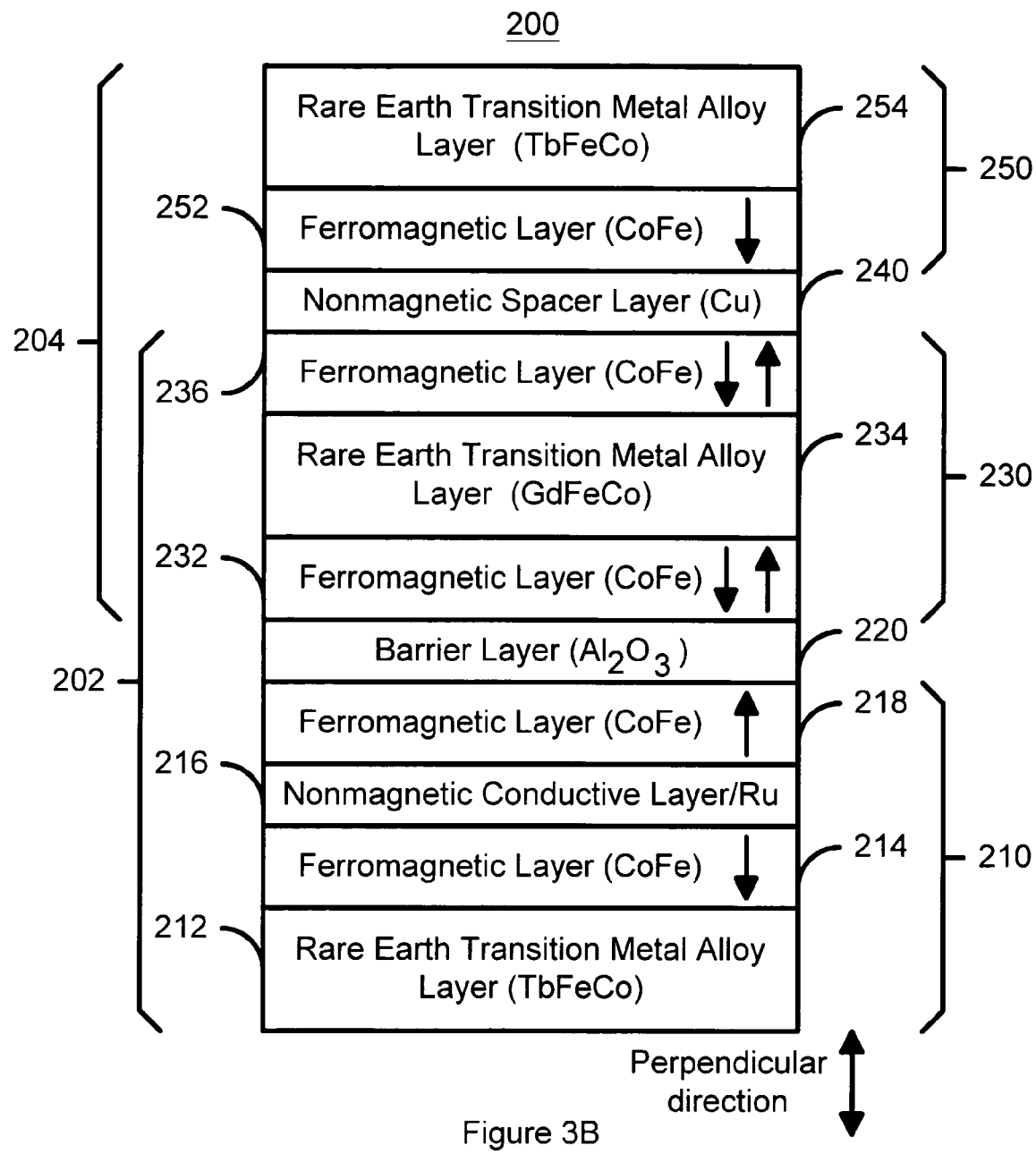
FIG. 3B is a first preferred embodiment of a magnetic element in accordance with the present invention utilizing layers having perpendicular magnetization.

FIG. 3B depicts a first preferred embodiment of a magnetic element 200 in accordance with the present invention utilizing layers having perpendicular magnetization. The magnetic element 200 is preferably used in a magnetic memory, such as a MRAM. Thus, the magnetic element 200 may be used in a memory cell including an isolation transistor (not shown), as well as other configurations of magnetic memories. Note that in addition to the layers shown, the magnetic element 200 may include other layers such as AFM layer(s) (not shown), seed layer(s) (not shown), and/or capping layer(s) (not shown). The magnetic element 200 can be considered to include a spin tunneling junction portion 202 and a spin valve portion 204. The magnetic element 200 includes a pinned layer 210, an insulating barrier layer 220 that is preferably $Al_2O_3$, a free layer 230, a nonmagnetic spacer layer 240 and a pinned layer 250. The nonmagnetic spacer layer 240 is conductive and is preferably Cu. The insulating barrier layer 220 is configured to allow charge carriers to tunnel between the free layer 230 and the pinned layer 210. Thus, the spin tunneling junction portion 202 includes pinned layer 210, insulating barrier layer 220, and free layer 230. The spin valve portion 204 includes the free layer 230, the nonmagnetic spacer layer 240, and the pinned layer 250. The spin valve portion 204 and the spin tunneling junction portion 202 thus share the free layer 230. The layers 210, 220, 230, 240, and 250 are analogous to the layers 110, 120, 130, 140, and 150 of the magnetic element 100 depicted in FIG. 3A. The spin tunneling junction portion 202 is thus analogous to the spin tunneling junction portion 102. Similarly, the spin valve 204 is analogous to the spin valve 104. Furthermore, the magnetic element 200 is configured such that the free layer 230 can be written using spin transfer.

The pinned layer 210 preferably has a perpendicular easy axis and, therefore, perpendicular magnetization due to its perpendicular anisotropy. In a preferred embodiment, the pinned layer 210 includes a rare earth transition metal layer 212 on which is a multilayer structure including a nonmagnetic conductive layer 216 sandwiched between two ferromagnetic layers 214 and 218. In a preferred embodiment, the rare earth transition metal layer 212 includes three hundred Angstroms of TbFeCo. Also in a preferred embodiment, the ferromagnetic layers 214 and 218 include twenty Angstroms of CoFe. Because of the interaction between the rare earth transition metal layer 212 and the ferromagnetic layer 214, the pinned layer 210 has an a perpendicular easy axis and, therefore, a perpendicular magnetization.

The free layer 230 preferably has a perpendicular easy axis and a perpendicular magnetization due to its perpendicular anisotropy. In one embodiment, the free layer 230 includes two ferromagnetic layers 232 and 236 separated by a rare earth transition metal layer 234. In such an embodiment, the ferromagnetic layers 232 and 236 each preferably include five to ten Angstroms of Co, Ni, Fe, their alloys, or CoX, CoFeX or CoNiFeX with X=Cu, B, Ru, Re, Rh, Pt, and Pd preferably being between five and sixty atomic percent. In such an embodiment, the rare earth transition metal layer 234 is preferably five hundred Angstroms of GdFeCo that has been tailored to have a low coercivity and a low magnetization. In an alternate embodiment, the rare earth transition metal layer 234 may be omitted. In such a case, the layer 232 is preferably CoFe while the layer 236 is preferably a bilayer of Pt/CoFe that has been repeated n times, where n is an integer. In such embodiments, the free layer 230 has a perpendicular anisotropy and, therefore, perpendicular easy axis and a perpendicular magnetization due to the interaction between the rare earth transition metal alloy layer 234 and the ferromagnetic layers 232 and 234 or because of the interface between the ferromagnetic layer and Pt layer.

The pinned layer 250 preferably has a perpendicular easy axis and, therefore, perpendicular magnetization due to its perpendicular anisotropy. In a preferred embodiment, the pinned layer 250 includes a rare earth transition metal layer 254 on a ferromagnetic layer 252. In a preferred embodiment, the rare earth transition metal layer 254 includes three hundred Angstroms of TbFeCo. Also in a preferred embodiment, the ferromagnetic layer 252 includes twenty Angstroms of CoFe. Because of the interaction between the rare earth transition metal layer 254 and the ferromagnetic layer 252, the pinned layer 250 has an a perpendicular easy axis and, therefore, a perpendicular magnetization. In the embodiment shown, the orientation of the magnetization of the portion of the pinned layer 210 closest to the free layer 230 is opposite to the orientation of the magnetization of the portion of the pinned layer 250 closest to the free layer 230. Stated differently, the ferromagnetic layer 218 preferably has its magnetization pinned in a direction opposite to the direction in which the magnetization of the ferromagnetic layer 252 is pinned. Thus, the magnetizations of the pinned layers 210 and 250 may be considered to be asymmetric with respect to the free layer 230.

Because of the perpendicular anisotropy of the free layer 230, the magnetic element 200 preferably shares the benefits of the magnetic element 100 including, but not limited to, a lower switching current density, stable perpendicular magnetizations even in the deep submicron region without requiring a high aspect ratio, a reduced distribution in coercivities of the free layer 230, a reduced offset in the magnetoresistance curve and the attendant improved reliability of the writing using spin transfer. Moreover, the magnetic element 200 may be simple to fabricate in that the perpendicular magnetization free layer 230 and pinned layers 210 and 250 may be deposited using physical vapor deposition, such as magnetron sputtering. Furthermore, a higher signal may be obtained because the resistivity of the barrier layer 220 of the spin tunneling junction portion 202 and tunnel magnetoresistance of 210 are higher. In addition, if the orientations of the pinned layers 210 and 250 are asymmetric as described above, both the spin tunneling junction portion 202 and the spin valve portion 204 of the magnetic element 200 contribute to switching of the free layer 230 using spin transfer. Consequently, an even lower switching current density of the magnetic element 200 may thus be achieved.

Figure 4:
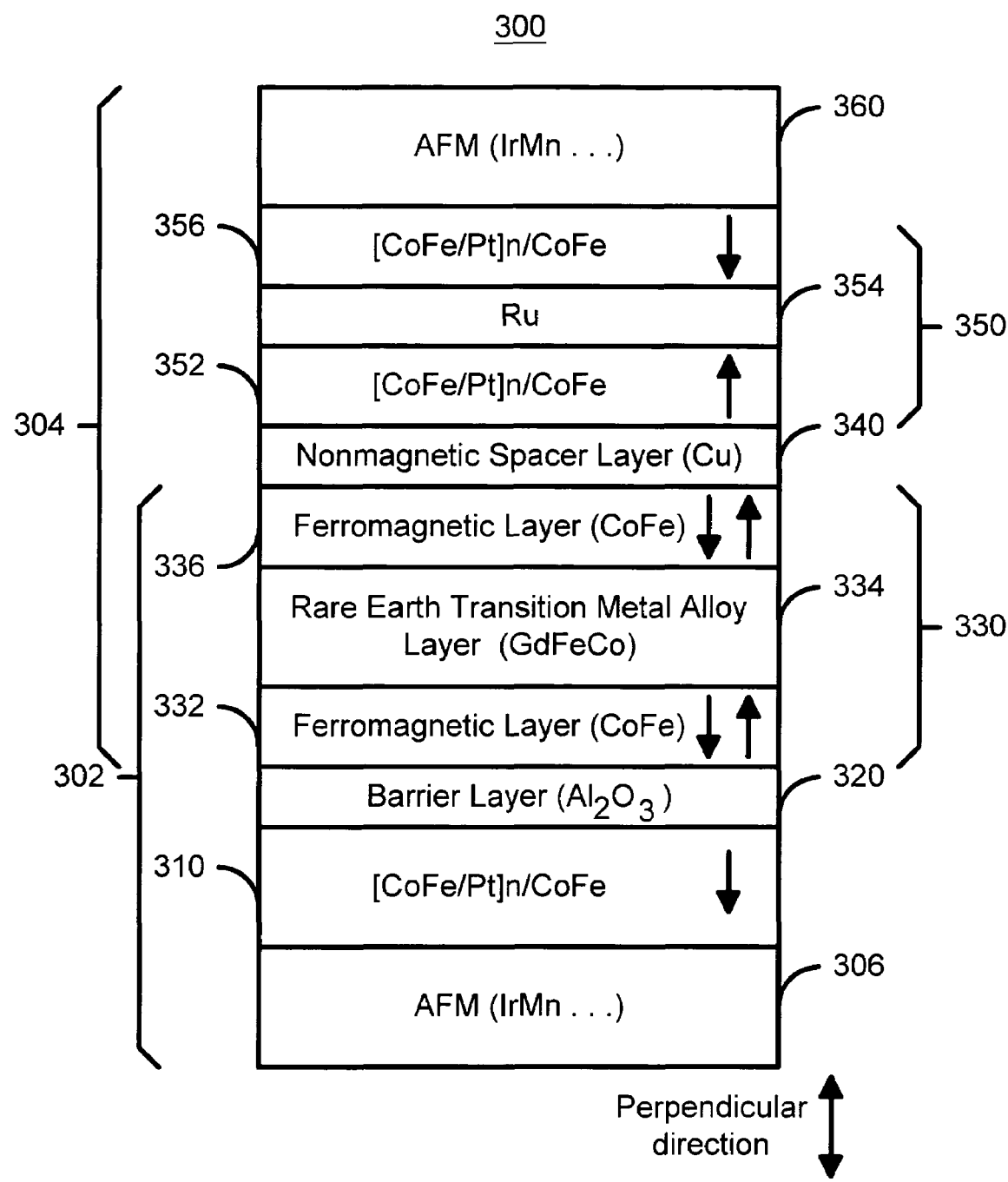
FIG. 4 is a second preferred embodiment of a magnetic element in accordance with the present invention utilizing layers having perpendicular magnetization.

FIG. 4 is a second preferred embodiment of a magnetic element 300 in accordance with the present invention utilizing layers having perpendicular magnetization. Note that in addition to the layers shown, the magnetic element 300 may include other layers such as seed layer(s) (not shown) and/or capping layer(s) (not shown). The components of the magnetic element 300 are analogous to the magnetic element 200. Consequently, these components of the magnetic element 300 are labeled similarly. For example, the magnetic element 300 can be considered to include a spin tunneling junction portion 302 and a spin valve portion 304 that are analogous to the spin tunneling junction portion 202 and the spin valve portion 204 of the magnetic element 200 depicted in FIG. 3B.

The magnetic element 300 includes an AFM layer 306, a pinned layer 310, a insulating barrier layer 320 that is preferably $Al_2O_3$, a free layer 330, a nonmagnetic spacer layer 340 that is preferably Cu, a pinned layer 350, and an AFM layer 360. The AFM layers 306 and 360 are preferably IrMn, but may include other AFM materials. Thus, the spin tunneling junction portion 302 includes the AFM layer 306, the pinned layer 310, the insulating barrier layer 320 that is preferably $Al_2O_3$, and the free layer 330. The spin valve portion 304 includes the free layer 330, the nonmagnetic spacer layer 340 that is preferably Cu, the pinned layer 350, and the AFM layer 360. The spin tunneling junction portion 302 is thus preferably analogous to the spin tunneling junction portion 102 of the magnetic element 100. The spin valve portion 304 is preferably analogous to the spin valve portion 104 of the magnetic element 100. Thus, the magnetic element 300 shares many of the benefits of the magnetic elements 100 and 200.

The pinned layer 310 preferably has a perpendicular easy axis and, therefore, perpendicular magnetization due to its perpendicular anisotropy. In a preferred embodiment, the pinned layer 310 includes a multilayer structure of a bilayer of CoFe/Pt repeated n times in combination with a CoFe layer. In a preferred embodiment, the integer n is from three through six. Because of the interfaces between the ferromagnetic CoFe layer and the Pt layer, the pinned layer 310 has a perpendicular anisotropy, a perpendicular easy axis and, therefore, a perpendicular magnetization.

The free layer 330 preferably has a perpendicular easy axis and a perpendicular magnetization due to its perpendicular anisotropy. In one embodiment, the free layer 330 includes two ferromagnetic layers 332 and 336 separated by a rare earth transition metal alloy layer 334. In such an embodiment, the ferromagnetic layers 332 and 336 each preferably include five to ten Angstroms of Co, Ni, Fe, their alloys, or CoX, CoFeX or CoNiFeX with X=Cu, B, Pt, Ru, Re, Rh and Pd preferably being between five and sixty atomic percent. In such an embodiment, the rare earth transition metal alloy layer 334 is preferably three hundred to five hundred Angstroms of GdFeCo that has been tailored to have a low coercivity and a low magnetization. In an alternate embodiment, the rare earth transition metal alloy layer 334 may be omitted. In such a case, the layer 332 is preferably CoFe while the layer 336 is preferably a bilayer of Pt/CoFe that has been repeated n times, where n is an integer. In such embodiments, the free layer 330 has a perpendicular anisotropy and, therefore, perpendicular easy axis and a perpendicular magnetization due to the interaction between the rare earth transition metal alloy layer 334 and the ferromagnetic layers 332 and 336 or because of the interface between the ferromagnetic layer and Pt layer.

The pinned layer 350 preferably has a perpendicular easy axis and, therefore, perpendicular magnetization due to its perpendicular anisotropy. In a preferred embodiment, the pinned layer 350 includes a multilayer structure of two bilayers 352 and 356 of CoFe/Pt repeated n times in combination with a CoFe layer separated by a Ru layer 354. In a preferred embodiment, the integer n is from three through six. Because of the interfaces between the ferromagnetic CoFe layer and the Pt layer of the layers 352 and 356, the pinned layer 350 has a perpendicular anisotropy, a perpendicular easy axis and, therefore, a perpendicular magnetization.

In the embodiment shown, the orientation of the magnetization of the portion of the pinned layer 310 closest to the free layer 330 is opposite to the orientation of the magnetization of the portion of the pinned layer 350 closest to the free layer 330. Stated differently, the pinned layer 310 preferably has its magnetization pinned in a direction opposite to the direction in which the magnetization of the bilayer 352 is pinned. Thus, the magnetizations of the pinned layers 310 and 350 may be considered to be asymmetric with respect to the free layer 330.

Because of the perpendicular anisotropy of the free layer 330, the magnetic element 300 preferably shares the benefits of the magnetic element 100 including, but not limited to, a lower switching current density, stable perpendicular magnetizations even in the deep submicron region without requiring a high aspect ratio, a reduced distribution in coercivities of the free layer 330, a reduced offset in the magnetoresistance curve and the attendant improved reliability of the writing using spin transfer. Moreover, the magnetic element 300 may be simple to fabricate in that the perpendicular magnetization free layer 330 and pinned layers 310 and 350 may be deposited using physical vapor deposition, such as magnetron sputtering. Furthermore, a higher signal may be obtained because the resistivity of the barrier layer 320 of the spin tunneling junction portion 302 and tunnel magnetoresistance of 302 are higher. In addition, if the orientations of the pinned layers 310 and 350 are asymmetric as described above, both the spin tunneling junction portion 302 and the spin valve portion 304 of the magnetic element 300 contribute to switching of the free layer 330 using spin transfer. Consequently, an even lower switching current density of the magnetic element 300 may thus be achieved.

Figure 5:
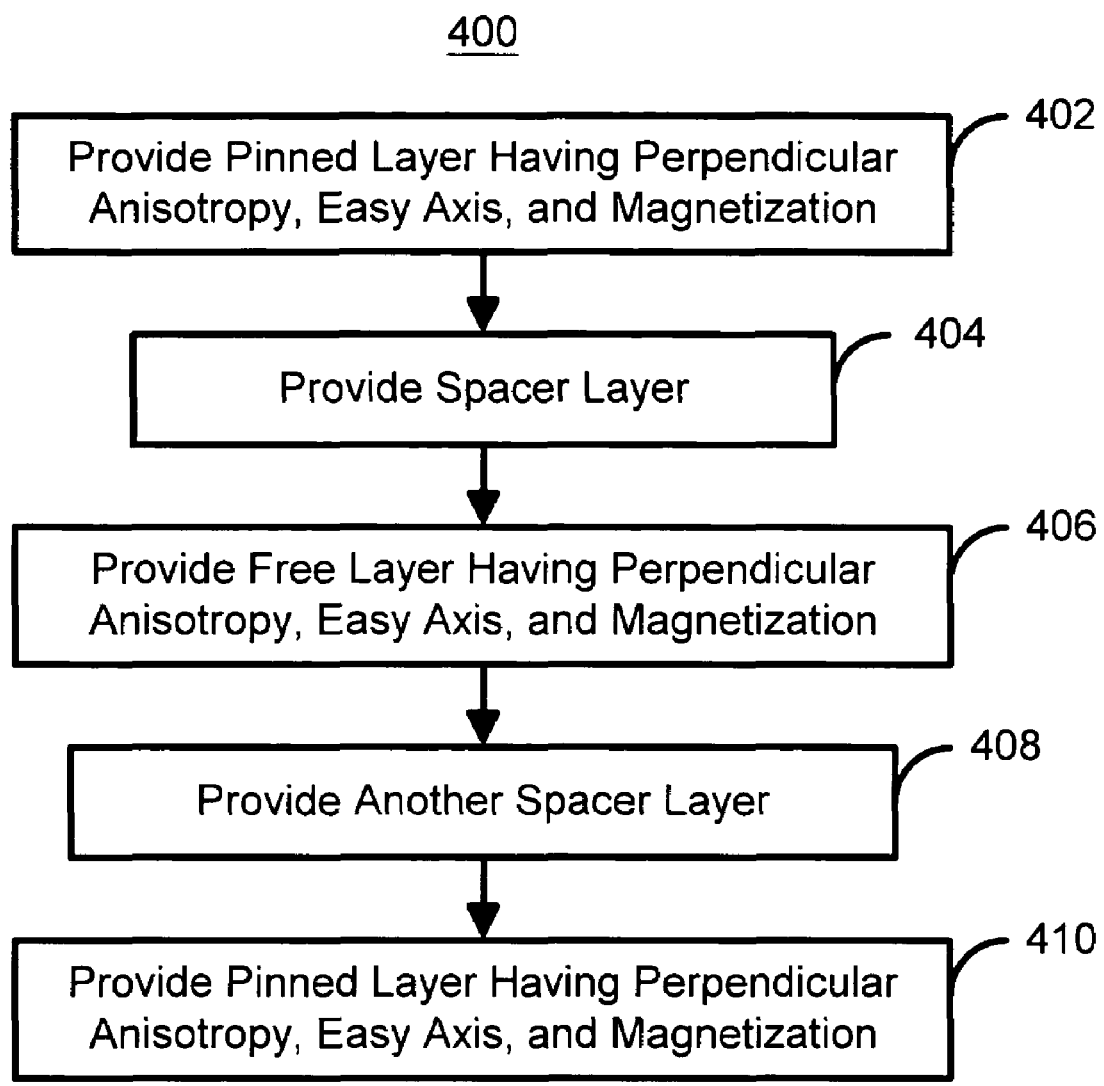
FIG. 5 is a high-level flow chart depicting one embodiment of a method for providing a magnetic memory utilizing layers having perpendicular magnetization in accordance with the present invention.

FIG. 5 is a high-level flow chart depicting one embodiment of a method 400 for providing a perpendicular magnetization magnetic memory in accordance with the present invention. One of ordinary skill in the art will readily recognize that for clarity, a number of steps have been omitted. A pinned layer having a perpendicular anisotropy, a perpendicular easy axis and, therefore, a perpendicular magnetization is provided, via step 402. In a preferred embodiment, step 402 includes depositing the pinned layer using physical vapor deposition techniques. A spacer layer is provided, via step 404. The spacer layer is nonmagnetic and may be an insulating barrier layer or a conductive layer. A free layer having a perpendicular anisotropy, a perpendicular easy axis and, therefore, a perpendicular magnetization is provided, via step 406. In a preferred embodiment, step 406 includes depositing the free layer using physical vapor deposition techniques. Another spacer layer is provided, via step 408. If the spacer layer provided in step 404 was an insulating barrier layer, then step 408 provides a nonmagnetic conductive spacer layer. Similarly, if the spacer layer provided in step 404 was a nonmagnetic conductive spacer layer, then step 408 provides an insulating barrier layer. A pinned layer having a perpendicular anisotropy, a perpendicular easy axis and, therefore, a perpendicular magnetization is provided, via step 410. In a preferred embodiment, step 410 includes depositing the pinned layer using physical vapor deposition techniques.

Thus, using the method 400, the magnetic elements 100, 200 and/or 300 may be provided relatively simply. Thus, the benefits of such magnetic elements 100, 200, and 300 may be achieved.

A method and system has been disclosed for providing a magnetic element including magnetic layers having perpendicular magnetization and in which the spin transfer switching current density is reduced. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetic element comprising:
   a first pinned layer having a first pinned layer easy axis, at least a portion of the first pinned layer easy axis being in a perpendicular direction;
   a spacer layer, the spacer layer being nonmagnetic and conductive;
   a free layer, the spacer layer residing between the first pinned layer and the free layer, the free layer having a free layer easy axis, at least a portion of the free layer easy axis being in the perpendicular direction
   a barrier layer, the barrier layer being an insulator and having a thickness that allows tunneling through the barrier layer;
   a second pinned layer having a second pinned layer easy axis, at least a portion of the second pinned layer easy axis being in the perpendicular direction, the barrier layer being between the free layer and the second pinned layer;
   wherein the magnetic element is configured to allow the free layer to be switched due to spin transfer when a write current is passed through the magnetic element.

2. The magnetic element of claim 1 wherein the free layer includes a bilayer of a ferromagnetic layer and a rare earth transition metal alloy layer.

3. The magnetic element of claim 2 wherein the rare earth transition metal alloy layer includes GdFe and/or GdFeCo.

4. The magnetic element of claim 2 wherein the ferromagnetic layer includes five to ten Angstroms of Co, Ni, Fe, their alloys, or CoX, CoFeX or CoNiFeX with X being between five and sixty atomic percent of Cu, B, Ru, Re, Rh, Pt and Pd.

5. The magnetic element of claim 1 wherein the free layer includes (Co/Pt)n or (CoCr/Pt)n, where n is an integer.

6. The magnetic element of claim 1 wherein the free layer includes (Fe/Pt)n or (CoFe/Pt)n, where n is an integer.

7. The magnetic element of claim 1 wherein the free layer includes [(CoPt)n/Co]/Ru/[(CoPt)n/Co] or [(CoCrPt)n/CoCr]/Ru/[(CoCrPt)n/CoCr] n, where n is an integer.

8. The magnetic element of claim 1 wherein the first pinned layer includes a bilayer of a ferromagnetic layer and a rare earth transition metal alloy layer.

9. The magnetic element of claim 8 wherein the rare earth transition metal alloy layer includes TbFe and/or TbFeCo.

10. The magnetic element of claim 1 wherein the first pinned layer includes (Co/Pt)n or (CoCr/Pt)n, where n is an integer.

11. The magnetic element of claim 1 wherein the first pinned layer includes (Fe/Pt)n or (CoFe/Pt)n, where n is an integer.

12. The magnetic element of claim 1 wherein the first pinned layer includes [(CoPt)n/Co]/Ru/[(CoPt)n/Co] or [(CoCrPt)n/CoCr]/Ru/[(CoCrPt)n/CoCr] n, where n is an integer.

13. The magnetic element of claim 1 wherein the first pinned layer includes [CoFe/Ru/CoFe].

14. The magnetic element of claim 1 wherein the second pinned layer includes a bilayer of a ferromagnetic layer and a rare earth transition metal alloy layer.

15. The magnetic element of claim 14 wherein the rare earth transition metal alloy layer includes TbFe and/or TbFeCo.

16. The magnetic element of claim 1 wherein the second pinned layer includes (Co/Pt)n or (CoCr/Pt)n, where n is an integer.

17. The magnetic element of claim 1 wherein the second pinned layer includes (Fe/Pt)n or (CoFe/Pt)n, where n is an integer.

18. The magnetic element of claim 1 wherein the second pinned layer includes [(CoPt)n/Co]/Ru/[(CoPt)n/Co] or [(CoCrPt)n/CoCr]/Ru/[(CoCrPt)n/CoCr] n, where n is an integer.

19. The magnetic element of claim 1 wherein the second pinned layer includes [(CoFePt)n/Ru/CoFePt].

20. The magnetic element of claim 1 wherein the free layer easy axis is in the perpendicular direction.

21. A method for providing a magnetic element comprising:
  (a) providing a first pinned layer having a first pinned layer easy axis, at least a portion of the first pinned layer easy axis being in a perpendicular direction;
  (b) providing a spacer layer, the spacer layer being nonmagnetic and conductive;
  (c) providing a free layer, the spacer layer residing between the first pinned layer and the free layer, the free layer having a free layer easy axis, at least a portion of the free layer easy axis being in the perpendicular direction
  (d) providing a barrier layer, the barrier layer being an insulator and having a thickness that allows tunneling through the barrier layer; and
  (e) providing a second pinned layer having a second pinned layer easy axis, at least a portion of the second pinned layer easy axis being in the perpendicular direction, the barrier layer being between the free layer and the second pinned layer;
  wherein the magnetic element is configured to allow the free layer to be switched due to spin transfer when a write current is passed through the magnetic element.

22. The method of claim 21 wherein the free layer providing step (c) includes providing a bilayer of a ferromagnetic layer and a rare earth transition metal alloy layer.

23. The method of claim 22 wherein the rare earth transition metal alloy layer includes GdFe and/or GdFeCo.

24. The method of claim 22 wherein the ferromagnetic layer includes five to ten Angstroms of Co, Ni, Fe, their alloys, or CoX, CoFeX or CoNiFeX with X being between five and sixty atomic percent of Cu, B, Ru, Re, Rh, Pt and Pd.

25. The method of claim 21 wherein the free layer providing step (c) includes providing (Co/Pt)n or (CoCr/Pt)n, where n is an integer.

26. The method of claim 21 wherein the free layer providing step (c) includes providing (Fe/Pt)n or (CoFe/Pt) n, where n is an integer.

27. The method of claim 21 wherein the free layer providing step (c) includes providing [(CoPt)n/Co]/Ru/[(CoPt)n/Co] or [(CoCrPt)n/CoCr]/Ru/[(CoCrPt)n/CoCr] n, where n is an integer.

28. The method of claim 21 wherein the first pinned layer providing step (a) includes providing a bilayer of a ferromagnetic layer and a rare earth transition metal alloy layer.

29. The method of claim 28 wherein the rare earth transition metal alloy layer includes TbFe and/or TbFeCo.

30. The method of claim 21 wherein the first pinned layer providing step (a) includes (Co/Pt)n or (CoCr/Pt)n, where n is an integer.

31. The method of claim 21 wherein the first pinned layer providing step (a) includes providing (Fe/Pt)n or (CoFe/Pt) n, where n is an integer.

32. The method of claim 21 wherein the first pinned layer providing step (a) further includes providing [(CoPt)n/Co]/Ru/[(CoPt)n/Co] or [(CoCrPt)n/CoCr]/Ru/[(CoCrPt)n/CoCr] n, where n is an integer.

33. The method of claim 21 wherein the first pinned layer providing step (a) further includes providing [CoFe/Ru/CoFe].

34. The method of claim 21 wherein the second pinned layer providing step (c) includes providing a bilayer of a ferromagnetic layer and a rare earth transition metal alloy layer.

35. The method of claim 34 wherein the rare earth transition metal alloy layer includes TbFe and/or TbFeCo.

36. The method of claim 21 wherein the second pinned layer providing step (c) includes providing (Co/Pt)n or (CoCr/Pt)n, where n is an integer.

37. The method of claim 21 wherein the second pinned layer providing step (c) includes providing (Fe/Pt)n or (CoFe/Pt)n, where n is an integer.

38. The method of claim 21 wherein the second pinned layer includes providing [(CoPt)n/Co]/Ru/[(CoPt)n/Co] or [(CoCrPt)n/CoCr]/Ru/[(CoCrPt)n/CoCr] n, where n is an integer.

39. The method of claim 21 wherein the second pinned layer providing step (c) includes providing [CoFe/Ru/CoFe].

40. The method of claim 21 wherein the free layer easy axis is in the perpendicular direction.

* * * * *